(12) United States Patent
Feng

(10) Patent No.: US 11,862,494 B2
(45) Date of Patent: Jan. 2, 2024

(54) CRANE MONITORING SYSTEM AND METHOD

(71) Applicant: CHANGXIN MEMORY TECHNOLOGIES, INC., Hefei (CN)

(72) Inventor: Wei Feng, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 352 days.

(21) Appl. No.: 17/447,189

(22) Filed: Sep. 8, 2021

(65) Prior Publication Data

US 2022/0013389 A1 Jan. 13, 2022

Related U.S. Application Data

(63) Continuation of application No. PCT/CN2021/100814, filed on Jun. 18, 2021.

(30) Foreign Application Priority Data

Jul. 9, 2020 (CN) .......................... 202010655230.7

(51) Int. Cl.
| | |
|---|---|
| *H01L 21/677* | (2006.01) |
| *H01L 21/67* | (2006.01) |
| *G01S 17/08* | (2006.01) |
| *G01S 7/4861* | (2020.01) |

(Continued)

(52) U.S. Cl.
CPC ........ *H01L 21/67259* (2013.01); *B66C 13/46* (2013.01); *G01S 7/4861* (2013.01);
(Continued)

(58) Field of Classification Search
CPC ......... H01L 21/67259; H01L 21/67736; H01L 21/67733; B66C 13/46; B66C 13/18; B66C 19/00; G01S 7/4861; G01S 17/08
See application file for complete search history.

(56) References Cited

U.S. PATENT DOCUMENTS 6,443,400 B2 * 9/2002 Murata ................ B61L 23/005
246/1 C
6,779,760 B2 8/2004 Chang
(Continued)

FOREIGN PATENT DOCUMENTS

| CN | 104692246 A | 6/2015 |
|---|---|---|
| CN | 208861958 U | 5/2019 |

(Continued)

OTHER PUBLICATIONS

International Search Report in the international application No. PCT/CN2021/100814, dated Aug. 30, 2021.

*Primary Examiner* — Gerald McClain
(74) *Attorney, Agent, or Firm* — Syncoda LLC; Feng Ma

(57) ABSTRACT

A crane monitoring system includes a first detection apparatus, a processing apparatus and a second detection apparatus. The first detection apparatus is configured to detect a position of a crane, to send a first detection signal when the crane is located above a Front Opening Unified Pod (FOUP) load port of a semiconductor processing device, and to send a second detection signal when the crane leaves a space above the FOUP load port. The processing apparatus is configured to generate a start control signal responsive to receiving the first detection signal, and to generate a stop control signal responsive to receiving the second detection signal. The second detection apparatus is configured to start a detection of whether there is a foreign matter between the crane and the FOUP load port after receiving the start control signal, and to stop the detection after receiving the stop control signal.

13 Claims, 6 Drawing Sheets

(51) Int. Cl.
*B66C 13/46* (2006.01)
*B66C 13/18* (2006.01)
*B66C 19/00* (2006.01)

(52) U.S. Cl.
CPC .......... *G01S 17/08* (2013.01); *H01L 21/6773* (2013.01); *H01L 21/67733* (2013.01); *H01L 21/67736* (2013.01); *B66C 13/18* (2013.01); *B66C 19/00* (2013.01)

(56) References Cited

U.S. PATENT DOCUMENTS

| | | | | |
|---|---|---|---|---|
| 9,305,815 | B2* | 4/2016 | Tung | H01L 21/67706 |
| 10,083,847 | B2* | 9/2018 | Tomida | H01L 21/67259 |
| 2003/0001118 | A1* | 1/2003 | Murata | H01L 21/67259 |
| | | | | 250/559.33 |
| 2003/0005561 | A1* | 1/2003 | Hahn | F16P 3/144 |
| | | | | 29/25.01 |
| 2004/0118980 | A1* | 6/2004 | Chang | H01L 21/6773 |
| | | | | 246/1 C |
| 2008/0128374 | A1* | 6/2008 | Kyutoku | B66C 13/04 |
| | | | | 212/276 |
| 2012/0175334 | A1* | 7/2012 | Chen | B66C 19/00 |
| | | | | 212/71 |
| 2020/0118853 | A1* | 4/2020 | Harasaki | G06T 7/0004 |
| 2020/0270102 | A1* | 8/2020 | Wada | H01L 21/67259 |
| 2022/0059380 | A1* | 2/2022 | Wada | H01L 21/67259 |
| 2022/0336244 | A1* | 10/2022 | Lin | H01L 21/67724 |
| 2022/0344188 | A1* | 10/2022 | Qin | B66C 13/16 |
| 2023/0202806 | A1* | 6/2023 | Fukushima | B66C 13/22 |
| | | | | 212/276 |

FOREIGN PATENT DOCUMENTS

| | | | |
|---|---|---|---|
| CN | 209065300 U | * | 7/2019 |
| CN | 209065300 U | | 7/2019 |
| CN | 209216941 U | | 8/2019 |
| TW | 200921830 A | | 5/2009 |

* cited by examiner

CRANE MONITORING SYSTEM AND METHOD

CROSS-REFERENCE TO RELATED APPLICATIONS

This is a continuation of International Patent Application No. PCT/CN2021/100814 filed on Jun. 18, 2021, which claims priority to Chinese Patent Application No. 202010655230.7 filed on Jul. 9, 2020. The disclosures of these applications are hereby incorporated by reference in their entirety.

BACKGROUND

During the wafer processing, a Front Opening Unified Pod (FOUP) loaded with a wafer is transported by a crane to a semiconductor device and loaded onto a FOUP load port of the semiconductor device.

SUMMARY

The present disclosure relates to a crane monitoring system and method.

According to the embodiments, a first aspect of the present disclosure provides a crane monitoring system, which includes:

a first detection apparatus configured to detect a position of a crane, to send a first detection signal when the crane is located above a FOUP load port of a semiconductor device, and to send a second detection signal when the crane leaves a space above the FOUP load port;

a processing apparatus electrically connected to the first detection apparatus, and configured to generate a start control signal responsive to receiving the first detection signal, and to generate a stop control signal responsive to receiving the second detection signal; and a second detection apparatus electrically connected to the processing apparatus, and configured to start a detection of whether there is a foreign matter between the crane and the FOUP load port after receiving the start control signal, and to stop the detection after receiving the stop control signal.

According to the embodiments, a second aspect of the present disclosure also provides a crane monitoring method, which includes the following operations.

A position of a crane is detected by a first detection apparatus, a first detection signal is sent by the first detection apparatus when the crane is located above a FOUP load port of a semiconductor device, and a second detection signal is sent by the first detection apparatus when the crane leaves a space above the FOUP load port.

A start control signal is generated by a processing apparatus when the first detection signal is received by the processing apparatus, and a stop control signal is generated by the processing apparatus when the second detection signal is received by the processing apparatus.

A detection of whether there is a foreign matter between the crane and the FOUP load port is started by a second detection apparatus after the start control signal is received by the second detection apparatus, and the detection is stopped by the second detection apparatus after the stop control signal is received by the second detection apparatus.

The details of one or more embodiments of the present disclosure are set forth in the accompanying drawings and descriptions below. Other features and advantages of the present disclosure will be apparent from the specification, the accompanying drawings, and the claims.

BRIEF DESCRIPTION OF THE DRAWINGS

In order to describe the technical solutions in embodiments of the present disclosure or the existing technology more clearly, the accompanying drawings required to be used in the embodiments or the existing technology will be simply introduced below. Apparently, the accompanying drawings in the following description show merely some embodiments of the present disclosure, and persons of ordinary skill in the art may still derive other drawings from these accompanying drawings without creative effort.

Figure 1:
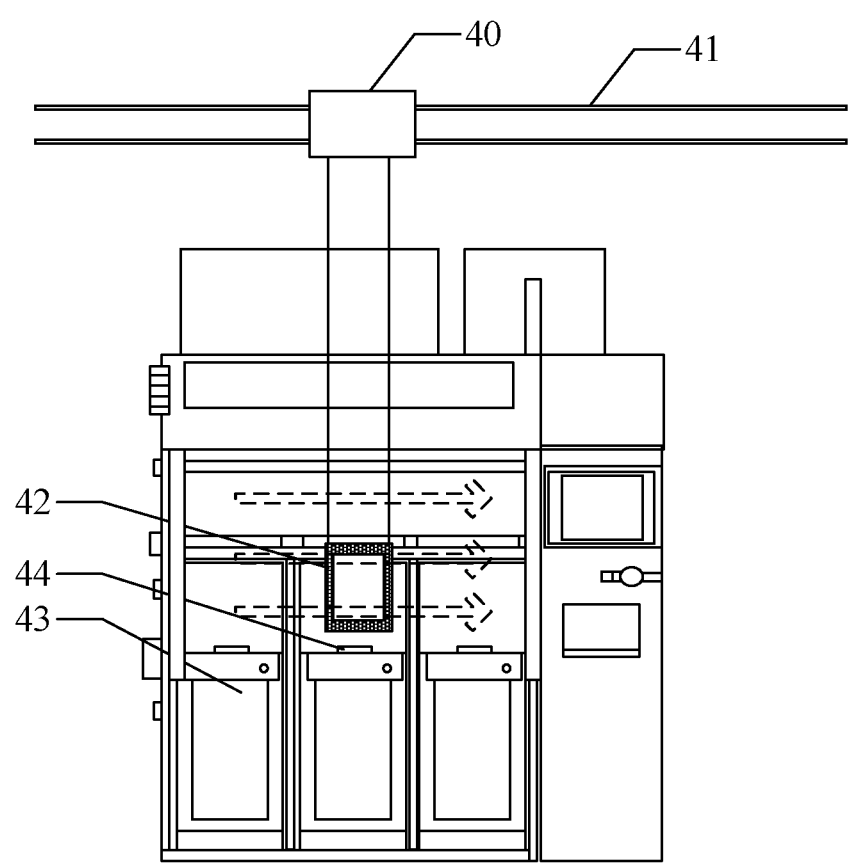
FIG. 1 is a schematic diagram showing a semiconductor device and a crane according to an embodiment of the present disclosure.

Reference numerals: 10, processing apparatus; 20, first detection apparatus; 201, light emitting apparatus; 202, light receiving apparatus; 30, second detection apparatus; 40, crane; 41, crane track; 42, FOUP; 43, semiconductor device; 44, FOUP load port.

DETAILED DESCRIPTION

In order to facilitate understanding of the present disclosure, the present disclosure will be described more fully hereinafter with reference to the accompanying drawings. Preferred embodiments of the present disclosure are illustrated in the accompanying drawings. However, the present disclosure may be embodied in many different forms and is not limited to the embodiments described herein. Rather, these embodiments are provided for the purpose of making a disclosure of the present disclosure more comprehensive.

Unless defined otherwise, all technical and scientific terms used herein have the same meaning as commonly understood by those skilled in the art to which the present disclosure belongs. The terminology used in the specification of the present disclosure is for the purpose of describing specific embodiments only and is not intended to limit the present disclosure. The term "and/or" used herein includes any and all combinations of one or more of the associated listed items.

In the description of the present disclosure, it should be noted that terminologies of "upper", "lower", "vertical", "horizontal", "inner", "outer" and the like that indicate relations of directions or positions are based on the relations of directions or positions shown in the accompanying drawings, which are only to facilitate description of the present disclosure and to simplify the description of the present disclosure, rather than to indicate or imply that the referred device or element is limited to the specific direction or to be operated or configured in the specific direction. Therefore, the above-mentioned terminologies shall not be interpreted as confine to the present disclosure.

When the FOUP is transported up and down by the crane, if there is a foreign matter (e.g., a worker or other objects) in a region between the FOUP load port of the semiconductor device and the crane, the worker or other objects may collide with the FOUP to cause damage to the wafer. In order to avoid this situation, in the related art, a light sensor is installed on the semiconductor device. A light emitting terminal is installed at one end of the semiconductor device, and a light receiving terminal is installed at the other end of the semiconductor device. When there is a foreign matter in the monitoring range of the light sensor, the semiconductor device sends a warning signal, and the crane will not transport the FOUP up and down, so that the worker is prevented from colliding with the FOUP.

As shown in FIG. 1, during the wafer processing, an FOUP 42 may be used to store and transport a wafer, and the FOUP is transported by a crane 40 to a semiconductor device 43 and loaded onto a FOUP load port 44 of the semiconductor device 43.

When the FOUP 42 is transported up and down by the crane 40, if there is a foreign matter (e.g., a worker or other objects) in a region between the FOUP load port of the semiconductor device and the crane, the worker or other objects may collide with the FOUP 42 to cause damage to the wafer. In order to avoid this situation, in the related art, a light sensor is installed on the semiconductor device 43. A light emitting terminal is installed at one end of the semiconductor device 43, and a light receiving terminal is installed at the other end of the semiconductor device. When there is a foreign matter in the monitoring range of the light sensor, the semiconductor device 43 sends a warning signal, and the crane 40 will not transport the FOUP 42 up and down, so that the worker is prevented from colliding with the FOUP 42.

However, there is a disadvantage in the related art that in a working state of the semiconductor device 43, the light sensor will keep working. In this case, when the crane 40 does not move up and down, if a worker wants to closely observe or photograph the wafer in the semiconductor device 43, it is difficult for the worker to move, and it is easy to trigger the light sensor to cause a false alarm.

Figure 2:
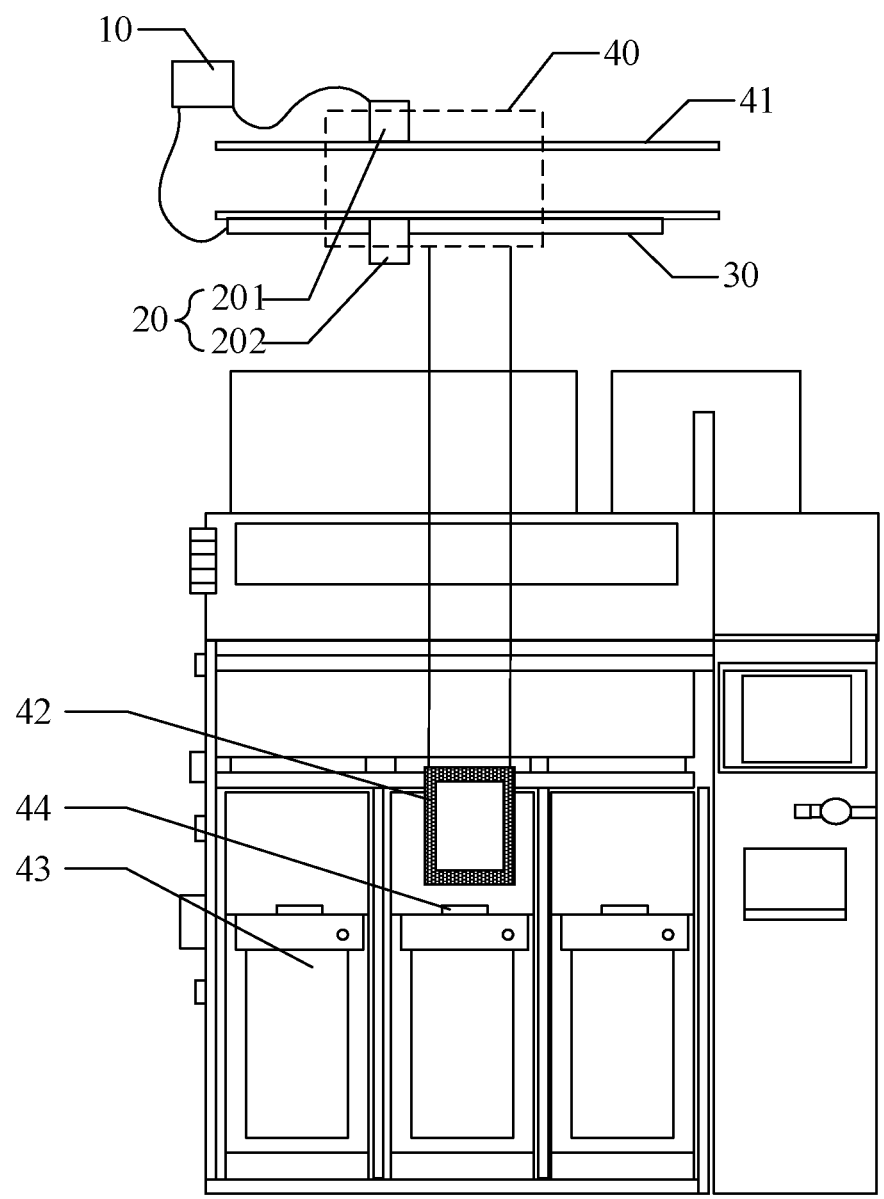
FIG. 2 is a schematic diagram showing a crane monitoring system according to an embodiment of the present disclosure.

As shown in FIG. 2, in order to solve the foregoing problems, the present disclosure provides a system for monitoring the crane 40. The system includes: a first detection apparatus 20 configured to detect a position of the crane 40, to send a first detection signal when the crane 40 is located above an FOUP load port 44, and to send a second detection signal when the crane 40 leaves a space above the FOUP load port 44; a processing apparatus 10 electrically connected to the first detection apparatus 20, and configured to generate a start control signal responsive to receiving the first detection signal, and to generate a stop control signal responsive to receiving the second detection signal; and a second detection apparatus 30 electrically connected to the processing apparatus 10, and configured to start a detection of whether there is a foreign matter between the crane 40 and the FOUP load port 44 after receiving the start control signal, and to stop the detection after receiving the stop control signal.

When the crane 40 reaches to the space above the FOUP load port 44 of the semiconductor device 43, the first detection apparatus 20 detects the crane 40 and thus sends a first detection signal. The processing apparatus 10 outputs the start control signal after receiving the first detection signal to trigger the second detection apparatus 30. In this case, the second detection apparatus 30 may be turned on and start the detection. Therefore, the second detection apparatus 30 may not perform the detection when the crane 40 does not stop in the space above the FOUP load port 44 of the semiconductor device 43 or when the crane 40 leaves the space above the FOUP load port 44 of the semiconductor device 43. In this case, when the worker is observing or photographing the wafer, he will not be detected by the second detection apparatus 30, thereby facilitating the observing and photographing operations of the worker.

In an alternative embodiment, the processing apparatus 10 generates the start control signal and sends the start control signal to the second detection apparatus 30 after the processing apparatus continuously receives the first detection signal within a first preset time. The start control signal may be set to be generated and sent when a second preset time (e.g., 1-2 s) has passed after the reception of the first detection signal. If the crane 40 leaves the space above the semiconductor device 43 within 1-2 seconds and the processing apparatus 10 does not continuously receive the first detection signal within the first preset time, the processing apparatus 10 does not generate and send the start control signal. That is, the second detection apparatus 30 does not receive the start control signal, which greatly reduces the situation that the second detection apparatus 30 is turned on by mistake since the crane 40 passes over the semiconductor device 43. The crane 40 does not affect the observing and photographing operations of the worker when the crane just passes over the semiconductor device 43.

Figure 3:
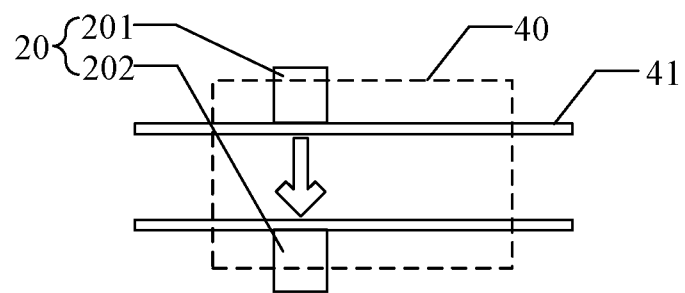
FIG. 3 is a schematic diagram showing a first detection apparatus according to an embodiment of the present disclosure.

As shown in FIG. 3, in an alternative embodiment, the crane 40 moves along a crane track 41. The first detection apparatus 20 is a light sensing detector and includes a light emitting apparatus 201 and a light receiving apparatus 202. The light emitting apparatus 201 is arranged on an upper side of the crane track 41, and the light receiving apparatus 202 is arranged on a lower side of the crane track 41. The light emitting apparatus 201 emits the detection light. The light receiving apparatus 202 is located on a light path of the detection light emitted by the light emitting apparatus 201. In an alternative embodiment, a direction of the light path of the detection light is perpendicular to a moving direction of the crane 40. The light emitting apparatus 201 and the light receiving apparatus 202 of the first detection apparatus 20 are fixedly connected to the crane track 41. The crane 40 passes between the light emitting apparatus 201 and the light receiving apparatus 202. When the crane 40 is located between the light emitting apparatus 201 and the light receiving apparatus 202, the light receiving apparatus 202 cannot receive the light emitted by the light emitting apparatus, so as to generate the first detection signal. When the light receiving apparatus 202 can receive the detection light emitted by the light emitting apparatus 201, the first detection apparatus 20 generates the second detection signal. Of course, in other examples, the first detection apparatus 20 may also be an acoustic detector and the like, as long as it is a detector that can realize the foregoing functions, which may be used herein as the first detection apparatus 20.

Figure 4:
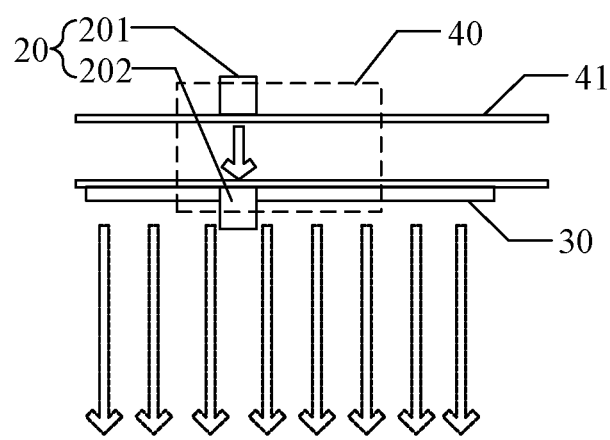
FIG. 4 is a schematic diagram showing a detection direction of a second detection apparatus according to an embodiment of the present disclosure.

Referring to FIG. 1 and FIG. 4, in an alternative embodiment, the second detection apparatus 30 is a ranging detector. The ranging detector is configured to detect a distance between the crane 40 and the FOUP load port 44, and transmit the detected detection data to the processing apparatus 10. The processing apparatus 10 determines whether there is a foreign matter between the crane 40 and the FOUP load port 44 based on the detection data. If there is a foreign matter between the crane 40 and the FOUP load port 44, the processing apparatus 10 sends a warning signal, and the FOUP will not be conveyed between the crane 40 and the FOUP load port 44. If the second detection apparatus 30 detects that there is no foreign matter between the crane 40 and the FOUP load port 44, the FOUP 42 may be conveyed between the crane 40 and the FOUP load port 44. During the conveyance of the FOUP 42 between the crane 40 and the FOUP load port 44, the second detection apparatus 30 is further configured to measure the distance between the FOUP 42 and the crane 40.

The ranging detector may be an ultrasonic ranging sensor, a laser ranging sensor, or an infrared ranging sensor. The ultrasonic ranging sensor is a sensor developed by using the characteristics of ultrasonic waves, which consists mainly of piezoelectric wafers, and can emit and receive ultrasonic waves. The ultrasonic waves may be significantly reflected by impurities or interfaces to form echoes. If the second detection apparatus 30 is an ultrasonic ranging sensor, the second detection apparatus 30 is fixedly connected to the crane track 41, and a sound wave emission direction of the second detection apparatus 30 faces to the FOUP load port 44. When the FOUP 42 is conveyed between the FOUP load port 44 and the crane 40 (the FOUP 42 is conveyed from the crane 40 to the FOUP load port 44 and the FOUP 42 moves from the FOUP load port 44 to the crane 40), the detection data of the second detection apparatus 30 includes the distance between the FOUP 42 and the crane 40.

The working principle of the laser ranging sensor is described as follows. After a laser pulse is generated on a target by a laser diode, the laser is scattered in all directions after being reflected by the target. Part of the scattered light is returned to a sensing receiver, is received by an optical system, and then is imaged onto an avalanche photodiode which is an optical sensor with an internal amplification function. Therefore, an extremely weak optical signal can be detected, and the time elapsed when the laser pulse is emitted, returned, and received can be recorded and processed, so that the target distance can be determined. If the second detection apparatus 30 is a laser ranging sensor, the second detection apparatus 30 is fixedly connected to the crane track 41, and an emission direction of the laser diode faces to the FOUP load port 44. When the FOUP 42 is conveyed between the FOUP load port 44 and the crane 40, the detection data of the second detection apparatus 30 includes the distance between the FOUP 42 and the crane 40.

The infrared ranging sensor has a pair of infrared signal emitting and receiving diodes. An infrared light beam is emitted by using the infrared ranging sensor, and a reflection process is formed after an object is irradiated by the infrared light beam. After the infrared light beam is reflected to the sensor, a signal is received, and then data of a time difference between emission and reception is received by CCD image processing. A distance from the object is calculated after the signal is processed by a signal processor. If the second detection apparatus 30 is a laser ranging sensor, the second detection apparatus 30 is fixedly connected to the crane track 41, and the infrared light emitted by the infrared ranging sensor faces to the FOUP load port 44. When the FOUP 42 is conveyed between the FOUP load port 44 and the crane 40, the detection data of the second detection apparatus 30 includes the distance between the FOUP 42 and the crane 40.

In an alternative embodiment, by measuring the distance between the FOUP 42 and the crane 40, a conveying speed of the FOUP 42 and whether the FOUP 42 is inclined may be detected when the FOUP 42 is conveyed between the crane 40 and the FOUP load port 44, so as to determine whether the FOUP 42 is abnormal during conveyance. Specifically, the processing apparatus 10 obtains a travelling speed trend graph and/or a swing balance trend graph of the FOUP 42 based on the detection data detected by the second detection apparatus 30. The processing apparatus 10 may be a central processing unit for processing information. When the FOUP 42 is detected by the second detection apparatus 30, a distance between the FOUP 42 and the crane track 41 is measured. These data are transmitted to the processing apparatus 10. The traveling speed of the FOUP 42 may be calculated through the change of the distance between the FOUP and the crane track, and the speed trend graph of the FOUP 42 may be made according to the detection data and the historical detection data. It is also possible to detect whether the FOUP 42 is inclined while the FOUP 42 is conveyed between the crane 40 and the FOUP load port 44, thereby obtaining a swing balance trend graph. By comparing the current detection data with the speed trend graph and/or the swing balance trend graph, it is possible to determine whether the FOUP 42 has an abnormal motion. Meanwhile, according to the data of the semiconductor device 43, it is determined whether the abnormal motion of the FOUP 42 is caused by the semiconductor device 43 or by the crane 40.

In an alternative embodiment, the processing apparatus 10 includes a transmission circuit for transmitting detection data detected by the second detection apparatus 30 to a main system for storage. The detection data is uploaded to the main system for storage through the transmission circuit, so that data loss possibly caused by system failure is avoided. Even if the device is replaced, the data is still reserved, thereby facilitating other subsequent researches.

In an alternative embodiment, the processing apparatus 10 includes a counting assembly for counting the number of times of starting and stopping of the second detection apparatus 30 and counting the capacity of the corresponding semiconductor device 43 within a specified time period based on the number of times of starting and stopping of the second detection apparatus 30. Since the second detection apparatus 30 works only when the semiconductor device 43 interacts with the FOUP 42, the number of times of starting and stopping of the second detection apparatus 30 corresponds to the capacity of the semiconductor device 43. A time period, such as an hour, a day, or a month, etc., is specified, and the capacity of the semiconductor device 43 within such a time period may be counted by counting the number of times of starting and stopping of the second detection apparatus 30 within the specified time period.

In an alternative embodiment, a detection range of the second detection apparatus 30 covers a region between the crane 40 and all of the FOUP load ports 44 on the semiconductor device 43. Therefore, less detection or false detection is not easy to occur.

Figure 5:
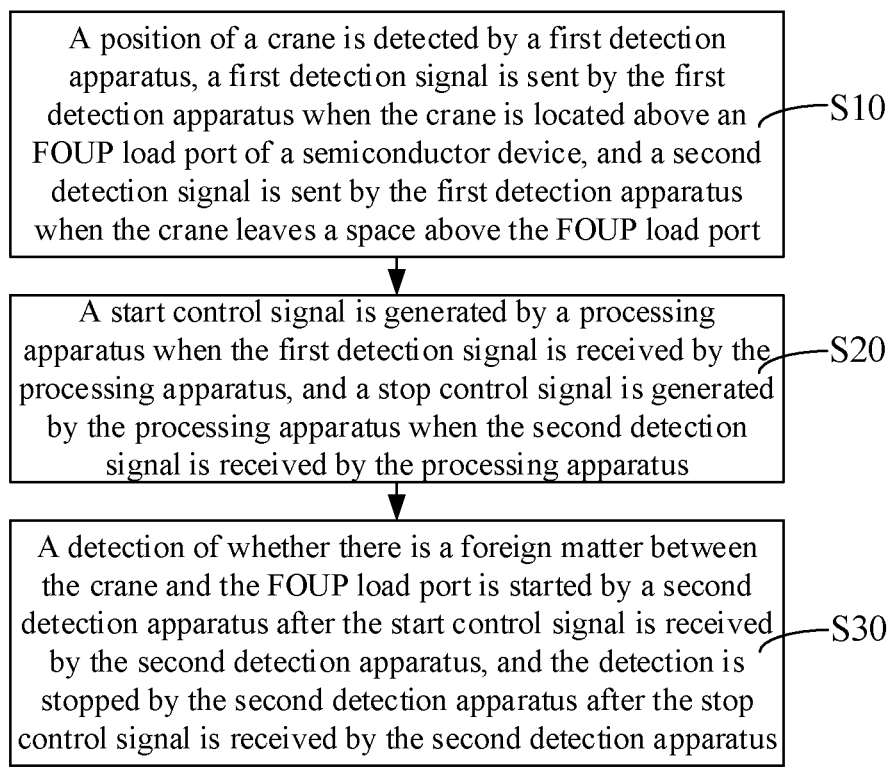
FIG. 5 is a flowchart of a crane monitoring method according to an embodiment of the present disclosure.

As shown in FIG. 5, the present disclosure also provides a method for monitoring a crane 40, which may be executed based on the crane monitoring system described in the above embodiments. For the specific structure of the crane monitoring system, reference is made to the above embodiments, which will not be repeated herein. The method includes the following operations.

In S10, a position of a crane 40 is detected by a first detection apparatus 20, a first detection signal is sent by the first detection apparatus when the crane 40 is located above an FOUP load port 44 of a semiconductor device 43, and a second detection signal is sent by the first detection apparatus when the crane 40 leaves a space above the FOUP load port 44.

In S20, a start control signal is generated by a processing apparatus 10 when the first detection signal is received by the processing apparatus, and a stop control signal is generated by the processing apparatus when the second detection signal is received by the processing apparatus.

In S30, a detection of whether there is a foreign matter between the crane 40 and the FOUP load port 44 is started by a second detection apparatus after the start control signal is received by the second detection apparatus, and the detection is stopped by the second detection apparatus after the stop control signal is received by the second detection apparatus.

In an alternative embodiment, in S10, specifically, the crane 40 moves along a crane track 41. The first detection apparatus 20 may be a light sensing detector and includes a light emitting apparatus 201 and a light receiving apparatus 202. The light emitting apparatus 201 is arranged on an upper side of the crane track 41, and the light receiving apparatus 202 is arranged on a lower side of the crane track 41. The light emitting apparatus 201 emits the detection light. The light receiving apparatus 202 is located on a light path of the detection light emitted by the light emitting apparatus 201. In an alternative example, a direction of the light path of the detection light is perpendicular to a moving direction of the crane 40. The light emitting apparatus 201 and the light receiving apparatus 202 of the first detection apparatus 20 are fixedly connected to the crane track 41. The crane 40 passes between the light emitting apparatus 201 and the light receiving apparatus 202. When the crane 40 is located between the light emitting apparatus 201 and the light receiving apparatus 202, the light receiving apparatus 202 cannot receive the light emitted by the light emitting apparatus, so that a first detection signal is generated. When the light receiving apparatus 202 can receive the detection light emitted by the light emitting apparatus 201, the first detection apparatus 20 generates a second detection signal.

In S20, in an alternative embodiment, specifically, the first detection apparatus 20 is electrically connected to the processing apparatus 10. The processing apparatus 10 generates a start control signal responsive to receiving the first detection signal, and generates a stop control signal responsive to receiving the second detection signal. The processing apparatus 10 may be a central processing unit for processing information.

In an alternative embodiment, the processing apparatus 10 generates the start control signal and sends the start control signal to the second detection apparatus 30 after the processing apparatus continuously receives the first detection signal within a first preset time. The start control signal may be set to be generated and sent when a second preset time (e.g., 1-2 s) has passed after the reception of the first detection signal. If the crane 40 leaves the space above the semiconductor device 43 within 1-2 seconds and the processing apparatus 10 does not continuously receive the first detection signal within the first preset time, the processing apparatus 10 does not generate and send the start control signal. That is, the second detection apparatus 30 does not receive the start control signal, which greatly reduces the situation that the second detection apparatus 30 is turned on by mistake since the crane 40 passes over the semiconductor device 43. The crane 40 does not affect the observing and photographing operations of the worker when the crane just passes over the semiconductor device 43.

In S30, in an alternative embodiment, specifically, the second detection apparatus 30 is a ranging detector. The ranging detector is configured to detect the distance between the crane 40 and the FOUP load port 44, and transmit the detected detection data to the processing apparatus 10. The processing apparatus 10 determines whether there is a foreign matter between the crane 40 and the FOUP load port 44 based on the detection data. If there is a foreign matter between the crane 40 and the FOUP load port 44, the processing apparatus 10 sends a warning signal.

The ranging detector may be an ultrasonic ranging sensor, a laser ranging sensor, or an infrared ranging sensor. The ultrasonic ranging sensor is a sensor developed by using the characteristics of ultrasonic waves, which consists mainly of piezoelectric wafers, and can emit and receive ultrasonic waves. The ultrasonic waves may be significantly reflected by impurities or interfaces to form echoes. If the second detection apparatus 30 is an ultrasonic ranging sensor, the second detection apparatus 30 is fixedly connected to the crane track 41, and a sound wave emission direction of the second detection apparatus 30 faces to the FOUP load port 44. When the FOUP 42 is conveyed between the FOUP load port 44 and the crane 40, the detection data of the second detection apparatus 30 includes the distance between the FOUP 42 and the crane 40.

The working principle of the laser ranging sensor is described as follows. After laser pulse is generated on a target by a laser diode, laser is scattered in all directions after being reflected by the target. Part of the scattered light is returned to a sensing receiver, is received by an optical system, and then is imaged onto an avalanche photodiode which is an optical sensor with an internal amplification function. Therefore, an extremely weak optical signal can be detected, and the time elapsed when the laser pulse is emitted, returned, and received can be recorded and processed, so that the target distance can be determined. If the second detection apparatus 30 is a laser ranging sensor, the second detection apparatus 30 is fixedly connected to the crane track 41, and an emission direction of the laser diode faces to the FOUP load port 44. When the FOUP 42 is conveyed between the FOUP load port 44 and the crane 40, the detection data of the second detection apparatus 30 includes the distance between the FOUP 42 and the crane 40.

The infrared ranging sensor has a pair of infrared signal emitting and receiving diodes. An infrared light beam is emitted by using the infrared ranging sensor, and a reflection process is formed after an object is irradiated by the infrared light beam. After the infrared light beam is reflected to the sensor, a signal is received, and then data of a time difference between emission and reception is received by CCD image processing. A distance from the object is calculated after the signal is processed by a signal processor. If the second detection apparatus 30 is a laser ranging sensor, the second detection apparatus 30 is fixedly connected to the crane track 41, and the infrared light emitted by the infrared ranging sensor faces to the FOUP load port 44. When the FOUP 42 is conveyed between the FOUP load port 44 and the crane 40, the detection data of the second detection apparatus 30 includes the distance between the FOUP 42 and the crane 40.

In an alternative embodiment, a detection range of the second detection apparatus 30 covers a region between the crane 40 and all of the FOUP load ports 44 on the semiconductor device 43. Therefore, less detection or false detection is not easy to occur.

Figure 6:
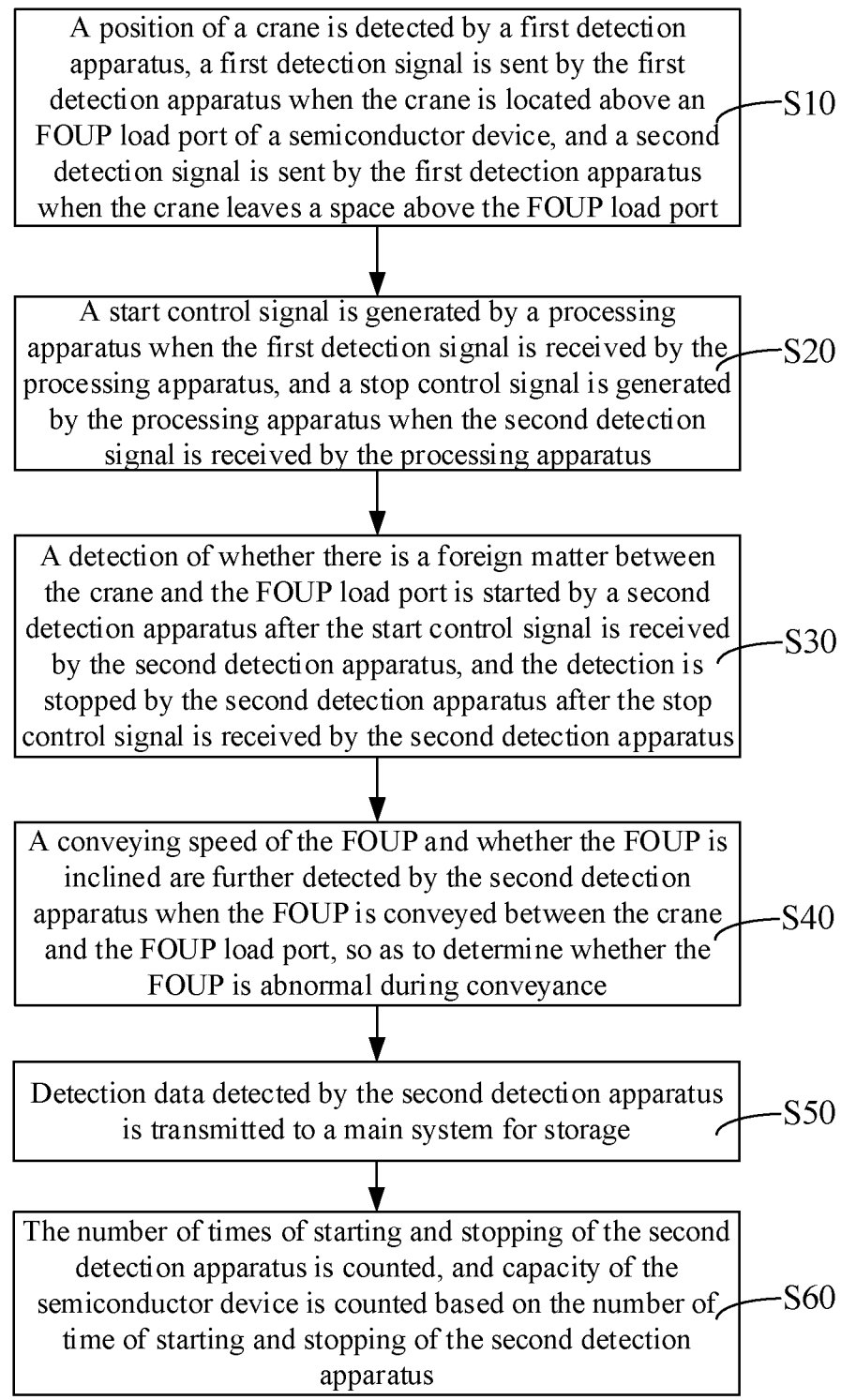
FIG. 6 is a flowchart of a crane monitoring method according to another embodiment of the present disclosure.

As shown in FIG. 6, in an alternative embodiment, after S30, the method further includes the following operations.

In S40, the FOUP 42 is conveyable between the crane 40 and the FOUP load port 44 after the second detection apparatus 30 detects that there is no foreign matter between the crane 40 and the FOUP load port 44, and a conveying speed of the FOUP 42 and whether the FOUP is inclined are further detected by the second detection apparatus 30 when the FOUP 42 is conveyed between the crane 40 and the FOUP load port 44, so as to determine whether the FOUP 42 is abnormal during conveyance.

Specifically, the second detection apparatus 30 is electrically connected to the processing apparatus 10, and transmits the detected detection data to the processing apparatus 10. When the second detection apparatus 30 detects that there is no foreign matter between the crane 40 and the FOUP load port 44, the FOUP 42 may be conveyed between the crane 40 and the FOUP load port 44. In the conveying process of the FOUP 42 between the crane 40 and the FOUP load port 44, the second detection apparatus 30 can measure the distance between the FOUP 42 and the crane 40 in real time.

The second detection apparatus 30 is further configured to detect the conveying speed of the FOUP 42 and whether the FOUP 42 is inclined when the FOUP 42 is conveyed between the crane 40 and the FOUP load port 44, so as to determine whether the FOUP 42 is abnormal during conveyance. The processing apparatus 10 obtains a travelling speed trend graph and/or a swing balance trend graph of the FOUP 42 based on the detection data detected by the second detection apparatus 30. The processing apparatus 10 may be a central processing unit for processing information. When the FOUP 42 is detected by the second detection apparatus 30, the distance between the FOUP 42 and the crane track 41 is measured. These data are transmitted to the processing apparatus 10. The traveling speed of the FOUP 42 may be calculated by the change of the distance between the FOUP and the crane track, and the speed trend graph of the FOUP 42 may be made according to the detection data and the historical detection data. It is also possible to detect whether the FOUP 42 is inclined while the FOUP 42 is conveyed between the crane 40 and the FOUP load port 44, thereby obtaining a swing balance trend graph. By comparing the current detection data with the speed trend graph and/or the swing balance trend graph, it is possible to determine whether the FOUP 42 has an abnormal motion. Meanwhile, according to the data of the semiconductor device 43, it is determined whether the abnormal motion of the FOUP 42 is caused by the semiconductor device 43 or by the crane 40.

As shown in FIG. 6, in an alternative embodiment, after S40, the method further includes the following operations.

In S50, detection data detected by the second detection apparatus 30 is transmitted to a main system for storage.

In S60, the number of times of starting and stopping of the second detection apparatus 30 is counted, and capacity of the semiconductor device 43 is counted based on the number of times of starting and stopping of the second detection apparatus 30.

In S50, specifically, the processing apparatus 10 includes a transmission circuit for transmitting the detection data detected by the second detection apparatus 30 to a main system for storage. The detection data is uploaded to the main system for storage through the transmission circuit, so that data loss possibly caused by system failure is avoided. Even if the device is replaced, the data is still reserved, thereby facilitating other subsequent researches.

In S60, specifically, the processing apparatus 10 includes a counting assembly for counting the number of times of starting and stopping of the second detection apparatus 30 and counting the capacity of the corresponding semiconductor device 43 within a specified time period based on the number of times of starting and stopping of the second detection apparatus 30. Since the second detection apparatus 30 works only when the semiconductor device 43 interacts with the FOUP 42, the number of times of starting and stopping of the second detection apparatus 30 corresponds to the capacity of the semiconductor device 43. A time period, such as an hour, a day, or a month, etc., is specified, and the capacity of the semiconductor device 43 within such a time period may be counted by counting the number of times of starting and stopping of the second detection apparatus 30 within the specified time period.

In the present disclosure, when the crane 40 reaches to the space right above the FOUP load port 44 and the FOUP 42 is ready to be lowered to a specified position, the first detection apparatus 20 detects the crane 40 and thus sends a first detection signal. The processing apparatus 10 outputs a start control signal after receiving the first detection signal to trigger the second detection apparatus 30. In this case, the second detection apparatus 30 may be turned on and start the detection. Therefore, the second detection apparatus 30 may not perform the detection when the crane 40 dose not transport the FOUP 42. In this case, when the worker is observing or photographing the wafer, he will not be detected by the second detection apparatus 30, thereby facilitating the observing and photographing operations of the worker.

The technical features of the embodiments described above can be arbitrarily combined. In order to make the description simple, not all the possible combinations of the technical features in the above embodiments are completely described. However, all of the combinations of these technical features should be considered as within the scope described in the present specification as long as there is no contradiction in the combinations of these technical features.

The above embodiments merely illustrate several implementations of the present disclosure, and the description thereof is specific and detailed, but they are not constructed as limiting the patent scope of the present disclosure. It should be noted that a number of variations and improvements made by those of ordinary skill in the art without departing from the conception of the present disclosure are within the protection scope of the present disclosure. Therefore, the patent protection scope of the present disclosure should be subject to the appended claims.

What is claimed is:

1. A crane monitoring system, comprising:
   a first detection apparatus configured to detect a position of a crane, to send a first detection signal when the crane is located above a Front Opening Unified Pod (FOUP) load port of a semiconductor processing device, and to send a second detection signal when the crane leaves a space above the FOUP load port;
   a processing apparatus electrically connected to the first detection apparatus, and configured to generate a start control signal responsive to receiving the first detection signal, and to generate a stop control signal responsive to receiving the second detection signal; and
   a second detection apparatus electrically connected to the processing apparatus, and configured to start a detection of whether there is a foreign matter between the crane and the FOUP load port after receiving the start control signal, and to stop the detection after receiving the stop control signal,
   wherein the processing apparatus generates the start control signal and sends the start control signal to the second detection apparatus after the processing apparatus continuously receives the first detection signal within a first preset time,
   wherein the processing apparatus comprises a counting assembly for counting a number of times of starting and stopping of the second detection apparatus and counting capacity of the semiconductor processing device based on the number of times of starting and stopping of the second detection apparatus.

2. The crane monitoring system of claim 1, wherein the crane moves along a crane track, the first detection apparatus is a light sensing detector and comprises a light emitting apparatus and a light receiving apparatus, the light emitting apparatus is arranged on an upper side of the crane track, the light receiving apparatus is arranged on a lower side of the crane track, and the light receiving apparatus is located on a light path of detection light emitted by the light emitting apparatus.

3. The crane monitoring system of claim 1, wherein the second detection apparatus is a ranging detector.

4. The crane monitoring system of claim 1, wherein a Front Opening Unified Pod (FOUP) is conveyable between the crane and the FOUP load port after the second detection apparatus detects that there is no foreign matter between the crane and the FOUP load port, and wherein the second detection apparatus is further configured to detect a conveying speed of the FOUP and whether the FOUP is inclined when the FOUP is conveyed between the crane and the FOUP load port, to determine whether the FOUP is abnormal during conveyance.

5. The crane monitoring system of claim 4, wherein the processing apparatus comprises a transmission circuit for transmitting detection data detected by the second detection apparatus to a main system for storage.

6. The crane monitoring system of claim 1, wherein a detection range of the second detection apparatus covers a region between the crane and all of FOUP load ports on the semiconductor processing device.

7. The crane monitoring system of claim 3, wherein the ranging detector is an ultrasonic ranging sensor, a laser ranging sensor, or an infrared ranging sensor.

8. The crane monitoring system of claim 2, wherein a direction of the light path of detection light is perpendicular to a moving direction of the crane.

9. A crane monitoring method, comprising:
detecting, by a first detection apparatus, a position of a crane; sending, by the first detection apparatus, a first detection signal when the crane is located above a Front Opening Unified Pod (FOUP) load port of a semiconductor processing device; and sending, by the first detection apparatus, a second detection signal when the crane leaves a space above the FOUP load port;
generating a start control signal by a processing apparatus responsive to receiving the first detection signal, and generating a stop control signal by the processing apparatus responsive to receiving the second detection signal; and
starting, by a second detection apparatus, a detection of whether there is a foreign matter between the crane and the FOUP load port after receiving the start control signal, and stopping, by the second detection apparatus, the detection after receiving the stop control signal,
the crane monitoring method further comprising: generating the start control signal by the processing apparatus and sending the start control signal to the second detection apparatus by the processing apparatus after the processing apparatus continuously receives the first detection signal within a first preset time;
wherein after starting, by the second detection apparatus, the detection of whether there is a foreign matter between the crane and the FOUP load port after receiving the start control signal, and stopping, by the second detection apparatus, the detection after receiving the stop control signal, the crane monitoring method further comprises:
transmitting detection data detected by the second detection apparatus to a main system for storage; and
counting a number of times of starting and stopping of the second detection apparatus, and counting capacity of a semiconductor processing device based on the number of times of starting and stopping of the second detection apparatus.

10. The crane monitoring method of claim 9, wherein after starting, by the second detection apparatus, the detection of whether there is a foreign matter between the crane and the FOUP load port after receiving the start control signal, and stopping, by the second detection apparatus, the detection after receiving the stop control signal, the crane monitoring method further comprises:
conveying a Front Opening Unified Pod (FOUP) between the crane and the FOUP load port after the second detection apparatus detects that there is no foreign matter between the crane and the FOUP load port; and
detecting, by the second detection apparatus, a conveying speed of the FOUP and whether the FOUP is inclined when the FOUP is conveyed between the crane and the FOUP load port, to determine whether the FOUP is abnormal during conveyance.

11. The crane monitoring method of claim 9, wherein the second detection apparatus is a ranging detector for detecting a distance between the crane and the FOUP load port and transmitting detected detection data to the processing apparatus.

12. The crane monitoring method of claim 9, wherein a detection range of the second detection apparatus covers a region between the crane and all of FOUP load ports on a semiconductor device.

13. The crane monitoring method of claim 11, wherein the ranging detector is an ultrasonic ranging sensor, a laser ranging sensor, or an infrared ranging sensor.

* * * * *